United States Patent
Smela et al.

[11] Patent Number: 6,103,399
[45] Date of Patent: Aug. 15, 2000

[54] METHOD FOR THE MANUFACTURING OF MICROMACHINED STRUCTURES AND A MICROMACHINED STRUCTURE MANUFACTURED USING SUCH METHOD

[75] Inventors: Elisabeth Smela, Hjälmsätersgatan 6C:40, 582 35 Linköping; Olle Inganäs, Wernersgatan 13, 582 46 Linköping; Ingemar Lundström, Färgaregatan 10, 582 52, Linköping; Ove Öhman, Uppsala, all of Sweden

[73] Assignees: Elisabeth Smela; Olle Inganäs; Ingemar Lundström, all of Linköping, Sweden

[21] Appl. No.: 08/913,232
[22] PCT Filed: Mar. 8, 1996
[86] PCT No.: PCT/SE96/00308
  § 371 Date: Dec. 30, 1997
  § 102(e) Date: Dec. 30, 1997
[87] PCT Pub. No.: WO96/28841
  PCT Pub. Date: Sep. 19, 1996

[30] Foreign Application Priority Data

Mar. 10, 1995 [SE] Sweden .................................. 9500849

[51] Int. Cl.$^7$ .................................................. H01L 21/06
[52] U.S. Cl. ............................ 428/623; 428/601; 428/612; 428/614; 428/620; 428/626; 428/641; 428/660; 428/670
[58] Field of Search ..................... 428/623, 601, 428/614, 612, 620, 626, 627, 630, 632, 641, 660, 665, 666, 670, 672; 438/50, 52, 117; 216/33, 95

[56] References Cited

U.S. PATENT DOCUMENTS

| | | |
|---|---|---|
| 5,015,906 | 5/1991 | Cho et al. . |
| 5,357,108 | 10/1994 | Suzuki et al. . |
| 5,447,600 | 9/1995 | Webb . |
| 5,472,539 | 12/1995 | Saia et al. . |
| 5,475,318 | 12/1995 | Marcus et al. . |
| 5,665,648 | 9/1997 | Little . |
| 5,772,902 | 6/1998 | Reed et al. . |
| 5,796,152 | 8/1998 | Carr et al. . |
| 5,885,468 | 4/1999 | Kozlowski . |

FOREIGN PATENT DOCUMENTS

| | | |
|---|---|---|
| 42 23 215 | 1/1994 | Germany . |
| WO 94/28426 | 12/1994 | WIPO . |

*Primary Examiner*—Deborah Jones
*Assistant Examiner*—Jason Savage
*Attorney, Agent, or Firm*—Browdy and Neimark

[57] ABSTRACT

The invention relates to a method for manufacturing a micromachined structure to be at least partly released from a substrate surface. A surface contact area, over which structure and the said substrate surface are in surface contact with each other during the manufacturing step, is divided into at least a first and a second contact zone, the adhesiveness between the structure and the substrate being greater in the first contact zone than in the second contact zone. As a manufacturing step, or as a step subsequent to the manufacturing, the structure can be released from the substrate surface at least over said second contact zone. The completed structure may also be completely loose from the substrate. The invention is also directed to a micromachined structure manufactured according to the method.

15 Claims, 7 Drawing Sheets

METHOD FOR THE MANUFACTURING OF MICROMACHINED STRUCTURES AND A MICROMACHINED STRUCTURE MANUFACTURED USING SUCH METHOD

TECHNICAL FIELD

This invention relates to a method for the manufacturing of micromachined structures (micromachines) and to a micromachined structure manufactured using such method. The invention is specifically usable in connection with the manufacturing of micromachined structures which are at least partially releasable. More specifically, the invention relates to the manufacturing of (i) micromachined structures with partly freed bending parts, (ii) micromachined structures with completely freed movable parts, and (ii) micromachined structures (or parts thereof that can be taken completely off a manufacturing substrate.

BACKGROUND ART

In the following, reference will be made i.a. to the list of prior-art references Ref. 1–12 on pages 20 and 21. These references are hereby incorporated by reference.

Micromachining allows the manufacturing of e g sensors and actuators with dimensions of nanometers to centimeters. Specific examples of micromachined objects include motors, pumps, accelerometers, pressure sensors, chemical sensors, valves, micro-motion systems and grippers. Overall surveys of micromachining are found e.g. in Ref. 1, 2 and 3.

Micromachined structures can be divided into the following three general classes C1–C3:

C1: Micromachined structures without any movable parts (wholly attached), such as holes etched in silicon substrates for fuel injection nozzles, or channels etched in glass or silicon for applications such as electrophoresis and other types of chemical analysis.

C2: Micromachined structures with bending parts (partly freed), such as probe tips for atomic force microscopy and related microscopies, pressure sensors, accelerometers, cantilevered beams, and peristaltic pumps. As an analogy, such a structure may be like a diving board, having one side firmly attached to the ground beside the swimming pool and the other side extending over the water to bend.

C3: Micromachined structures with movable parts (completely freed), such as micromotors and comb drives. As an analogy, such a structure may be like a turntable, the spinning platter on which the record is placed corresponding to the completely freed part, whereas the part which attaches the platter to the turntable corresponds to another part of the structure attaching the freed part to the substrate.

The following three general classes of micromachining are known in the art: (1) surface micromachining, (2) bulk micromachining, and (3) LIGA and variations thereof. The fabrication sequence for the manufacture of a micromachine may include a combination of these techniques.

According to the first one of said techniques of micromachining—surface micromachining—layers are deposited and etched on one side of a wafer as disclosed in Ref. 4. Ref. 5 discloses an example of an organic microactuator manufactured according to this technique. Prior-art surface micromachining requires the selective etching of a temporary sacrificial layer in order to release a device or structure which has been patterned from overlying structural layers. Many combinations of sacrificial/structural layers are possible, as long as the underlying sacrificial layer can be preferentially removed. Sacrificial layers can be manufactured from diverse materials, typically $SiO_2$ or phosphosilicate glass, but aluminum, photoresist, polyimide, porous silicon and others may also be used.

In contrast thereto, according to the second one of said techniques of micromachining—bulk micromachining—devices or structures are made directly from a silicon wafer or a wafers of another substrate material, such as gallium arsenide (GaAs), by selectively removing unwanted parts from the front and/or back sides of the wafer by an etching process (Ref. 6). Bulk micromachining has been used for the manufacturing of micromachines such as membranes, pumps and accelerometers. Two or more substrates may also be bonded together and etched.

Surface and bulk micromachining methods are compared in Ref. 1 and Ref. 7.

The third one of said techniques of micromachining—LIGA and variations thereof comprises the steps of patterning a photoresist or some other suitable polymer using x-rays or ultraviolet light, and depositing material into the resulting holes in the resist by electroplating. This method, as such, results in loose parts, and movable machines built from such loose parts must therefore be assembled by hand. LIGA can also be combined with the sacrificial layer method (Ref. 8).

The only prior-art technique used for releasing movable parts of micromachined structures is the above-described sacrificial-layer technique. This prior-art method traditionally comprises the step of liberating mechanical structures by underetching another underlying thin sacrificial layer, in order to allow components free rotation, translation, or bending. Drawbacks of this method are mentioned i.a. in Ref. 9 and 10 and will be discussed in detail below. The attached FIGS. 1–5, each of which comprises a cross sectional view (a) and a corresponding top view (b), illustrate the process steps according to a typical example of the prior-art sacrifical-layer technique. FIGS. 1–5 are schematic and are not to scale, and the dimensions in the vertical direction are greatly exaggerated.

In a first step (FIG. 1), a substrate 10, such as a silicon wafer, (optionally presenting pre-deposited layers and/or devices) is covered by a sacrificial layer 12. In a second step (FIG. 2), the sacrificial layer 12 is patterned so that a remaining portion thereof only partly covers the surface of the substrate 10 leaving an exposed surface portion 11 of the substrate 10. In a third step (FIG. 3), a structural layer 14 is deposited over the exposed surface portion 11 of the substrate 10 and over the patterned sacrificial layer 12. In a fourth step (FIG. 4), the structural layer 14 is patterned so that a remaining portion thereof partly covers the exposed surface portion 11 of the substrate 10 and partly cover the patterned sacrificial layer 12. In a fifth step (FIG. 5), the patterned sacrificial layer 12 is removed by an underetching process, whereby the remaining portion of the structural layer 14 presents one attached or fixed part 14a and one free-standing part 14b. The free-standing part 14b may form a movable part of the micromachined structure.

Optionally, multiple levels of patterned sacrificial layers and structural layers may be provided. Subsequent to the application of such multiple structural layers, the sacrificial layers are removed by underetching, thereby freeing overlying parts of the micromachined structure.

Although the sacrificial-layer method illustrated in FIGS. 1–5 works satisfactorily for many applications, to produce free-standing or movable parts of a micromachined structure, it has at least the following four main drawbacks.

A first drawback of the sacrificial-layer method is that the etching agents used to remove the sacrificial layer(s) may also damage the overlying structure. This damage can arise because the etching agents may react chemically with the overlaying structural layers, e.g. dissolving them or oxidizing them. The etching process may also damage the structure by generating heat and bubbles. The heat may damage the materials or may warp the structure, and the gas bubbles may impart excess mechanical stress to the structure.

A second drawback of the sacrificial-layer method is that underetching large structures is time-consuming and may be difficult to complete. Consider as an example a plate of 1000×1000 $\mu m^2$ lying over a 1 $\mu m$ thick sacrificial layer to be removed at an etch rate of 0,1 $\mu m$/min. The etching agent removes material starting from the edges of the plate and works its way to the center thereof, a distance of 500 $\mu m$ from the plate edge. Thus, the etching would take at least 5000 min. to complete, i.e. more than three days assuming a constant etch rate. However, the removal of material from deep underneath such a relatively large plate is difficult, because fresh etching agent (liquid or gas) does not circulate freely in confined geometries. Therefore, the etch rate actually decreases over time. As a result of the above, large solid plates are difficult or impossible to release by using this prior-art method, and they are today provided with through-holes, so that the underetching is practical.

A third drawback of the sacrificial-layer method is that the use of a sacrificial layer results in a geometrical step for the structural layer. The sacrificial layer cannot be too thin or the underetching becomes even more difficult. Mechanical stress arising at said step of the structural layer may be a problem. In addition, it is difficult to coat "vertical" walls using micromachining. Therefore, if the structural layer is too thin, it may not connect over said step, making the fabrication impossible.

A fourth drawback is that the structural layer must be self-supporting, because a gap is present between the freed structural part and the substrate after removing the sacrificial layer. Also for this reason, the structural layer cannot be too thin, and this limits what can be manufactured.

U.S. Pat. No. 5,447,600 (fled on Mar. 21, 1994, issued on Sep. 5, 1995) discloses a method for reducing sticking between contacting elements in a micromechanical device. A protective layer is formed on a first contact element to reduce the likelihood of a first contacting element sticking to another contacting element. However, the protective layer is not used for the actual manufacturing of the movable part of the structure or the release thereof from the substrate after manufacturing.

DISCLOSURE OF THE INVENTION

Accordingly, a first object of the present invention is to provide a novel method for the manufacture of micromachined structures not presenting the above mentioned drawbacks of the prior-art methods.

A specific object of the invention is to provide a manufacturing method which does not present the above-mentioned drawback of underetching sacrificial layers, and which allows solid plates, etc. of arbitrary size to be released or freed from a substrate surface, and which avoids use of noxious chemicals, heat and bubbles so that delicate materials can be used in the final structure without any risk of damage during the manufacturing process.

Another object of the invention is to provide a manufacturing method which does not require any significant geometrical step in the structure, in order to reduce stress in the structure and the risk of bad connection between different levels of the structure.

Still another object of the invention is provide a manufacturing method which does not require the freed structure to be mechanically self-supporting, so that very thin structural layers may be used.

An object of the invention is also to provide a n, micromachined structure manufactured using a manufacturing method fulfilling the above objects.

The above and further other objects of the invention will become apparent hereinafter.

According to the invention there is provided a method for manufacturing a micromachined structure to be at least partly released from a substrate surface. The method comprises the step of providing a substrate having a substrate surface and the step of manufacturing said structure on said substrate surface. The method is characterized by the step of dividing a surface contact area, over which a structure surface of the structure and the said substrate surface arc in surface contact with each other during the manufacturing step, into at least a first and a second contact zone, the adhesiveness between the structure and the substrate being greater in the first contact zone than in the second contact zone, whereby the structure, as a manufacturing step or as a stop subsequent to the manufacturing is completed, can be released from the substrate surface at least over said second contact zone.

According to a first aspect of the invention, the inventive method for the release of parts of a micromachine relies on a difference in adhesiveness of different parts of the micromachine to the substrate surface.

According to a second aspect of the invention, the inventive method for the release of parts of a micromachine relies on a difference in adhesiveness of different parts of the micromachine to the substrate surface.

These two aspects can be combined.

The difference in adhesiveness can be accomplished chemically or mechanically, but other methods for accomplishing the difference in adhesiveness are also envisaged.

The term "micromachined structure" is defined as a physical structure composed, at least partly, of one or more elements made by the deposition and patterning of materials deposited on a substrate.

The term "substrate" is defined as a physical structure serving as a supporting material, normally disposed under the deposited materials. Specifically, a substrate as such may also include a micromachined structure.

Deposition methods that may be used in connection with the invention include, as non-limiting examples only, evaporation sputtering, chemical vapor deposition, laser ablation, spin coating, spin casting, coating with rollers, dipping, molecular beam epitaxy, electroplating, and printing.

Pattern transferring methods that may be used in connection with the invention include, as non-limiting examples only, x-ray lithography, printing, shadow masking, and contact printing using monolayers. Pattern forming methods that may be used include, as non-limiting examples only, wet chemical etching, reactive ion etching and other dry chemical etching methods, laser abliation, atomic ford and scanning tunneling deposition or etching methods, and lift-off.

The above and other features, and preferred modes of implementation of the invention are defined in the attached claims.

BRIEF DESCRIPTION OF THE DRAWINGS

For a more complete understanding of the present invention, and the advantages thereof, reference is now made to the following description of preferred embodiment in conjunction with the attached drawings. All figures are schematic and no, to scale, and vertical dimensions are greatly exaggerated. Figures comprising cross sectional views (a) and top views (b) are occasionally referred to only by their figure numbers. This applies to FIGS. 1–5, FIGS. 6–13, and FIGS. 18–23.

EXAMPLES FOR CARRYING OUT THE INVENTION

The present method for manufacturing micromachined structures is briefly described below in Examples 1–6 with reference to FIGS. 6–23. The examples are intended to illustrate but not to limit the scope of the invention. In the following a "micromachine" means a micromachined structure.

As mentioned above, the inventive method for the release of parts of a micromachine from a substrate relies on a difference in adhesiveness of different parts of the surface under the micromachine to the micromachine, or a difference in adhesiveness of different parts of the micromachine to the substrate surface. This difference in adhesiveness can be accomplished chemically (Examples 2, 3 and 6) or mechanically (Examples 4 and 5), but other methods for accomplishing the difference in adhesiveness are also envisaged.

EXAMPLE 1

FIGS. 6–12 illustrate the process steps of a first embodiment of the inventive method for the manufacturing of micromachined structures in the form of bilayer actuators.

Figure 1A:
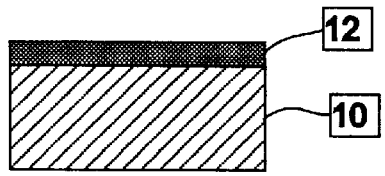
FIGS. 1–5 illustrate the process steps according to a prior-art sacrificial-layer technique for the manufacturing of a micromachined structure.
Figure 1B:
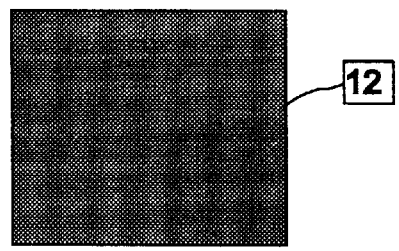
Figure 2A:
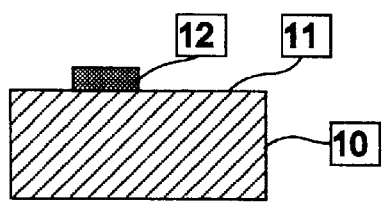
Figure 2B:
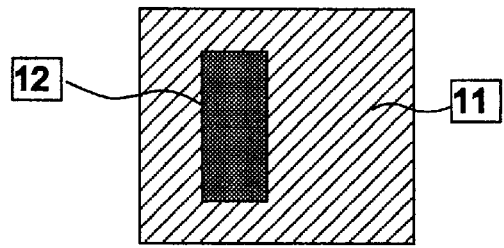
Figure 3A:
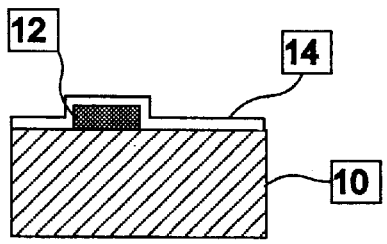
Figure 3B:
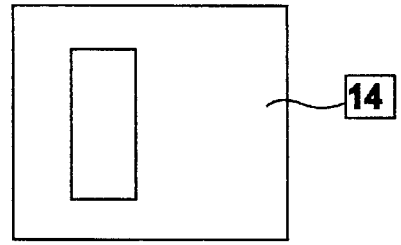
Figure 4A:
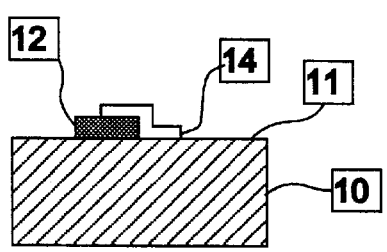
Figure 4B:
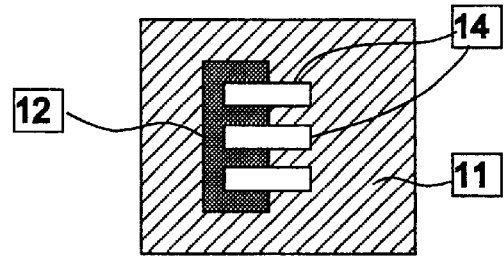
Figure 5A:
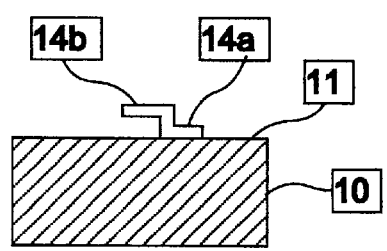
Figure 5B:
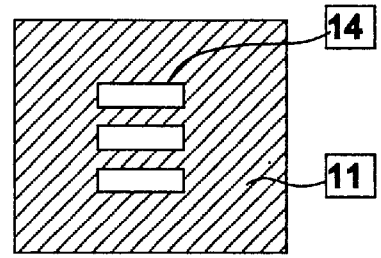
Figure 6A:
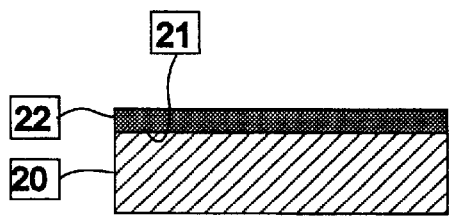
FIGS. 6–12 illustrate the process steps according to a first embodiment (Example 1) of the present invention, using a Cr layer as an adhesive layer, for the manufacturing of a micromachined structure.
Figure 6B:
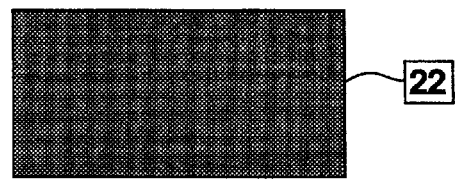

A standard 3-inch diameter silicon (Si) CZ wafer (purchased from Okmetic, Espoo, Finland, 380 micrometers thick, (100) orientation, p-type, boron-doped, 1–10 Ohm-cm conductivity) was used as a substrate 20. On a polished side 21 of the substrate 20, a first layer 22 in the form of a 30 Å thick adhesive layer of chromium (Cr) as deposited by vacuum evaporation as illustrated in FIG. 6.

Figure 7A:
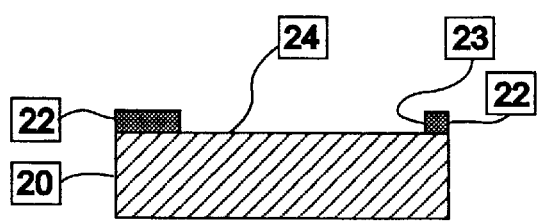

Next, as shown in FIG. 7, the Cr layer 22 was patterned. The patterning was done by spin-coating the Cr layer 22 with a photoresist (Microposit 1818S Photo Resist, Shipley Europe Ltd., Coventry, England) at 8000 rpm for 30 seconds on a Headway Research Inc., Garland, Tex. spinner, followed by soft baking at 100° C. for 90 seconds on a hot plate. Thereafter, the resist was exposed to UV light through a Cr/glass mask (mask blanks from Ulcoat, Tokyo, Japan) using a mask aligner (Karl Süiss KG, type 401000, München. Germany) for 6 seconds at an intensity of approximately 5 mW/cm$^2$ and at a wavelength of 365 nm. The resist was developed for 60 seconds in Microposit 351 Developer diluted 5:1 in water. The Cr layer 22 was then etched in a standard Cr-etch solution of 3.5 g Ce(SO$_4$)$_2$×4H$_2$O, 17.5 ml HNO$_3$ (65%), and 32.5 ml H$_2$O. All chemicals were purchased from E. Merck, Darmstadt, Germany. Subsequent to the etching of the Cr layer 22, the resist was stripped with a remover (Microposit Remover 1112A) diluted with an equal amount of water. Developing, etching and stripping were done at room temperature.

Figure 7B:
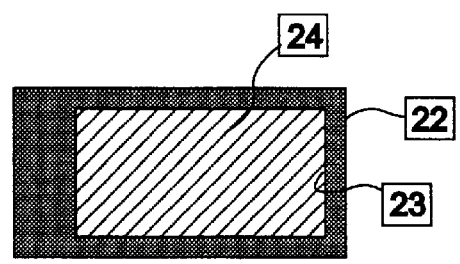

As best shown in FIG. 7b, the thus-patterned Cr layer 22 was in the form of a frame defining a rectangular opening 23 exposing a bare or free Si surface area 24. A base of bilayer actuators to be described below would later be fixed to the edge of the Cr frame 22, whereas the rest of the actuators would lift off the exposed Si surface area 24 when actuated.

Figure 8A:
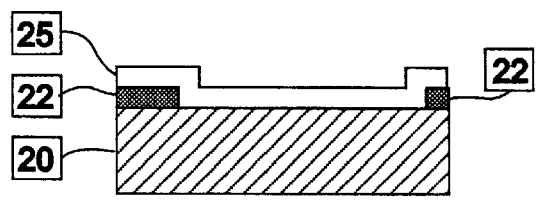
Figure 8B:
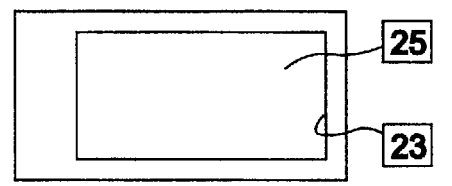

As shown in FIG. 8, a second layer 25 in the form of a 200 Å thick gold (Au) layer was deposited by vacuum, evaporation over the patterned Cr layer 22 and over the exposed Si surface area 24. Immediately prior to said evaporation, the patterned Cr layer 22 was etched briefly in Cr-etchant (described above), rinsed in a dilute nitric acid solution, rinsed in water, and blown dry with a stream of nitrogen to remove any native oxide. Because in subsequent steps a conducting polymer film was used, the choice of metal for this second layer 25 was restricted: it was essential for this particular structure to use Au or another noble metal film. Otherwise, the metal could have reacted to form surface species that would have prevented the growth and/or adhesion of the conducting polymer.

Figure 9A:
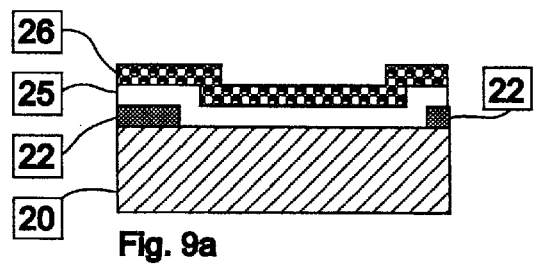
Figure 9B:
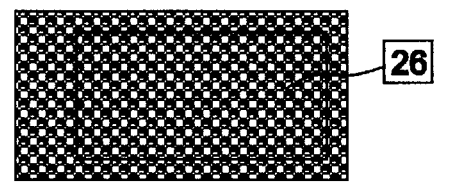

As shown in FIG. 9, a third layer in the form of a Polypyrrole (PPy) layer 26—a conducting polymer—was polymerized electro-chemically to a thickness of 3000–3000 Å over the surface of the gold layer 25 at a constant 0.6 V in a solution of 0.1M pyrrole monomers. purchased from E. Merck and distilled prior to us, and 0.1M of the sodium salt of dodecylbenzenesulfonate (NaxDBS), from Aldrich, Steinheim, Germany. in deionized water. The PPy layer 26 foam, ed the second layer of he ultimate bilayer actuators. The polymer layer 26 can be electromechanically synthesized or can be chemically polymerized and deposited by spin-coating.

Figure 10A:
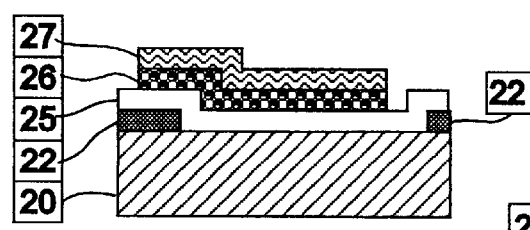
Figure 10B:
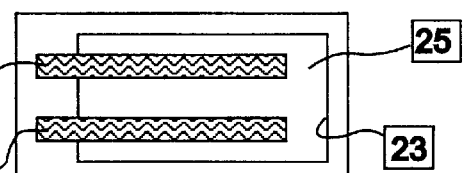

A photoresist 27 was spin coated over the PPy layer 26, soft-baked, exposed, and developed as described above. The PPy layer 26 was then etched by dry chemical etching using reactive ion etching (RIE) in an oxygen plasma, leaving strips of various sizes as shown in FIG. 10, e. g. strips with an area of 30 mm×1000 mm.

Figure 11A:
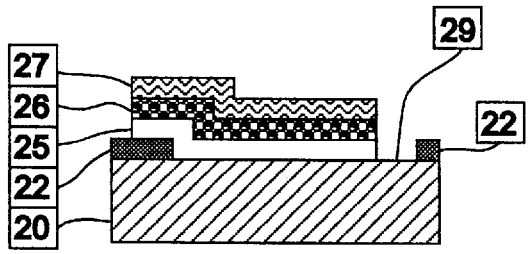
Figure 11B:
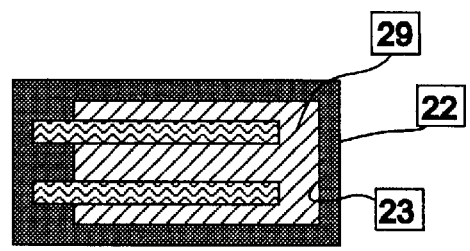

As shown in FIG. 11, the exposed portion of the Au layer 25 was etched away using a standard gold-etch solution of 1g $I_2$, 2g Kl and 50 ml $H_2O$ (chemicals purchased from E. Merck). During this step, the overlying resist layer 27 and the overlaying PPy layer 26 protected the Au layer 25 from chemical attack. Subsequent to this Au etching, gold was left only under the PPy 26, leaving an exposed surface area 29 of the Si substrate 20.

Figure 12A:
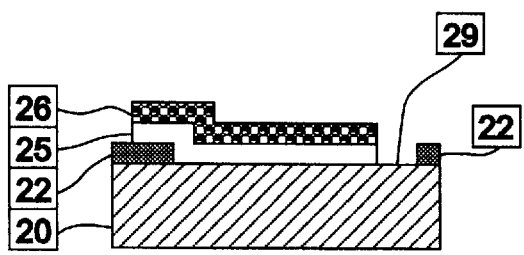
Figure 12B:
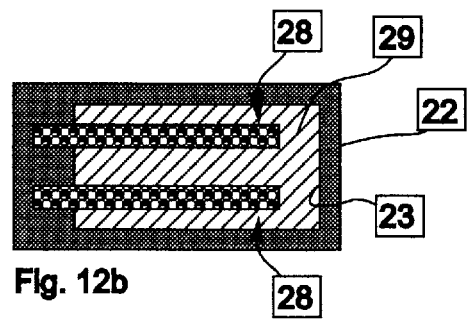

Next, as illustrated in FIG. 12, the photoresist 27 remaining over the PPy 26 was removed by RIE in an oxygen plasma. The plasma was turned off when the PPy 26 was exposed. FIG. 12b shows the two completed PPy/Au bilayer actuators 28.

Each of the completed bilayer actuators 28 comprised the Au layer 25 and the PPy layer 26. A base portion of each actuator 28 (e.g. the left end thereof in FIG. 12) was attached to the Cr frame 22, whereas the rest of the actuator 28 was in direct contact with the surface of the Si substrate 20. The issue of whether or not the substrate 20 as such should be considered as an integral part of the actuators is not of any primarily importance to the inventive concept and depends e.g. on the intended use of the actuators and on any optional further process steps to be taken.

Figure 13A:
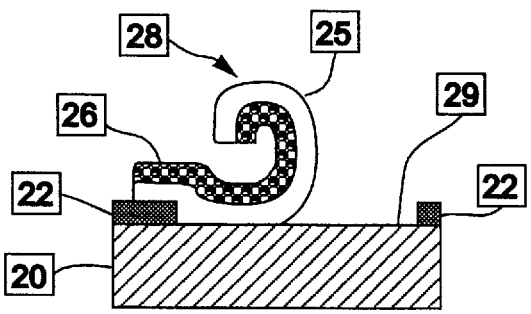
FIG. 13 illustrates an electrochemical oxidation/reduction of a PPy layer of the micromachined structure according to FIG. 12, in order to make a bilayer actuator bend and release from the substrate surface.
Figure 13B:
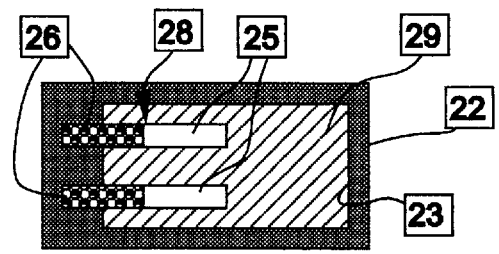

As shown in FIG. 13, the non-attached part of the bilayer actuators 28 (to the right in FIG. 13) were caused to bend away from the substrate 20. This was done by using an electrochemical oxidation/reduction of the Pty layer 26 in an electrolyte, such as 0.1 M NaxDBS (purchased from E. Merck) in deionized water, which resulted in a volume change of the PPy layer 26. Thereby, each bilayer actuator 28 released itself from the Si surface, curling into spirals.

Other substrates 20 that could have been used include glass slides and SiO2-covered wafers. Other materials, such as titanium (Ti), to which the subsequent layer 25 also adheres could have been used instead of Cr. Furthermore, although PPy was used in this example, any other conducting polymer or volume-changing polymer could have been used, including polyaniline, polythiophene, polyprrole, derivatives of these polymers, and copolymers of any of these. Although electrochemically driven changes in the volume of conducting polymers were used to drive the devices in this example, other possibilities exist for actuation and could have been used instead, including: piezoelectricity, solvent swelling, thermal expansion, chemical interactions, reaction to exposure to radiation, phase changes, or other stimuli.

EXAMPLE 2

Figure 14A:
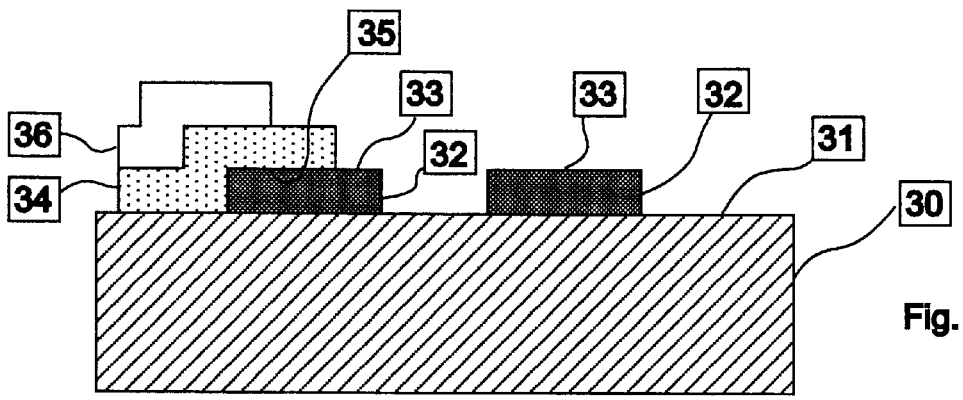
FIG. 14a is a cross sectional view illustrating a second embodiment (Example 2) of the invention for the manufacturing of micromachines which are at least partially releasable.

A micromachine may be manufactured according to the following steps with reference to FIG. 14a, using as a first layer a thin film on a simple, flat substrate:

a) a substrate 30 with an outer surface 31 is at least partly covered with a first layer 32 which is strongly adherent to the outer surface 31 and of which at least its outer surface 33, being the surface of the first layer 32 facing away from the substrate 30, has another adhesiveness than the outer substrate surface 31;

b) the first layer 32 is at least partly patterned;

c) a second layer 34, which is the bottom-most layer of the to-be-deposited layers comprising the micromachine, is deposited onto the substrate 30 and the patterned first layer 32, the second layer 34 having an adhesiveness such that at least its inner surface 35 adheres differently to the otter surface 33 of the patterned first layer 32 than those areas of the substrate surface 31 which are not covered by the patterned first layer 32;

d) optionally, the second layer 34 is patterned, e) possibly remaining further layers, such as layer 36, comprising the micromachine are deposited onto the second layer 34, and possibly also onto the patterned first layer 32 and/or the substrate 30, and are patterned according to the design of the micromachine;

f) if the second layer 34 adheres to the patterned first layer 32 but not to the substrate 30, or only Weakly to the substrate 30, then the completed micromachine will be affixed to the substrate 30 at points where it is in contact with the outer surface 33 of the first layer 32, but will be free to come off the substrate 30 at points where it is in contact with the outer surface 31 thereof, or g) if, on the other hand, the second layer 34 adheres to the substrate 30 but not to the first layer 32, or only weakly to the first layer 32, then the completed micromachine will be affixed to the substrate 30 at points where it is in contact with the outer surface 31 thereof, but will be free to come off the substrate 30 at points where it is in contact with the outer surface 33 of the first layer 32.

Each one of the first layer 32, the second layer 34 and any further layer(s) 36 may be a metal film, a grown or deposited oxide, a polymer, or a chemical monolayer. Other materials are not excluded.

Figure 14B:
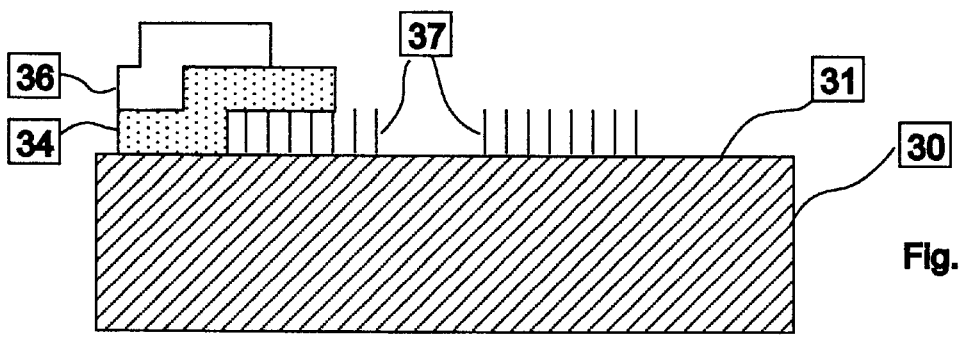
FIGS. 14b and 14c are modifications of FIG. 14a, using monolayers on the substrate surface.
Figure 14C:
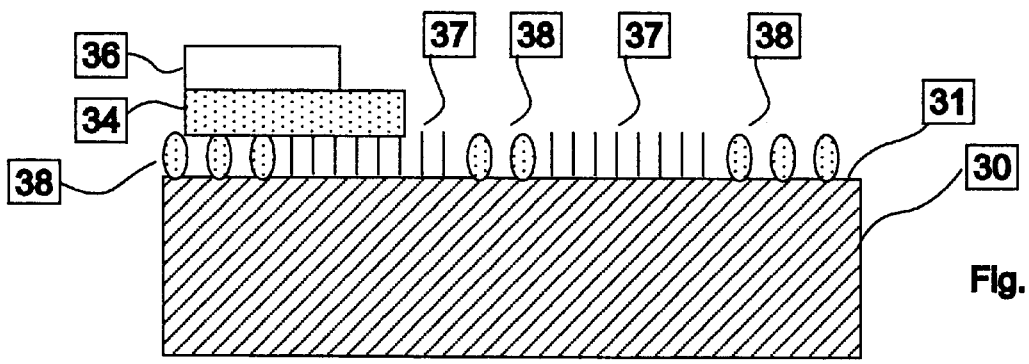

As illustrated schematically in FIGS. 14b and 14b, the surface 31 of the substrate 32 in Example 2 may be partly or wholly covered with a monolayer. In FIG. 14b, the first layer is a bound chemical monolayer 37. In the modification shown in FIG. 14c, the first layer is also a bound chemical monolayer 37, but a second, previously attached and patterned monolayer 38 is also applied to the substrate surface 31. In all the embodiments shown in FIGS. 14a–c, the substrate 30 presents different surface areas with different adhesiveness.

EXAMPLE 3

Figure 15:
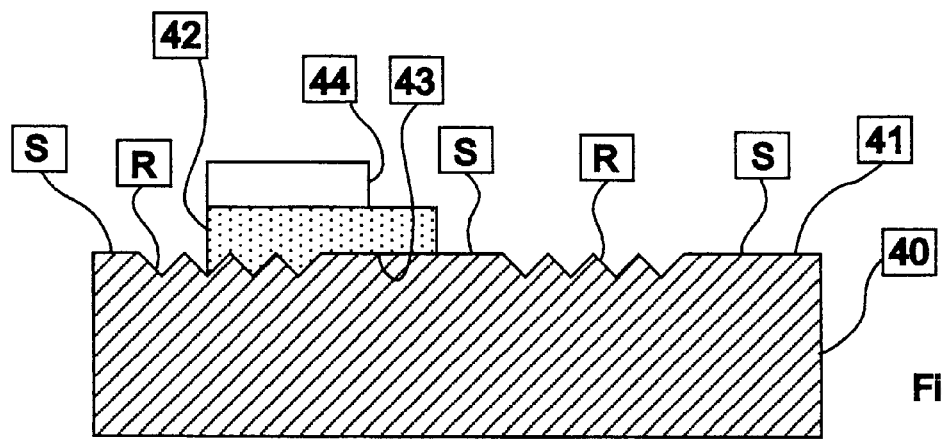
FIG. 15 is a cross sectional view illustrating a third embodiment (Example 3) of the invention for the manufacturing of micromachines which are at least partially releasable.

A micromachine may be manufactured according to the following steps with reference to FIG. 15, using a substrate 40 having surface areas S and R with different roughness:

a) a substrate 40 is provided, the outer surface 41 thereof having at least one relatively smooth area S and at least one area with increased roughness R;

b) a bottom structural layer 42, which is the bottom-most layer of the to-be-deposited layers comprising the micromachine, is deposited onto the substrate 40, the bottom layer 42 having an adhesiveness such that at least its inner surface 43 adheres differently to the relatively smooth area(s) S than to the area(s) with increased roughness R;

c) optionally, the bottom layer 42 is patterned;

d) possibly remaining further layers, such as layer 44 in FIG. 15, comprising the micromachine are deposited onto the bottom layer 42, and possibly also onto the relatively smooth area(s) S and/or the area(s) with increased roughness R, and are patterned according to the design of the micromachine;

e) if the bottom layer 42 adheres to the area(s) with increased roughness R but not to the relatively smooth area(s) S, or only weakly to the relatively smooth area(s) S, then the completed micromachine will be affixed to the substrate 40 at points where it is in contact with the area(s) with increased roughness R, but will be free to come off the substrate 40 at points where it is in contact with the relatively smooth area(s) S; or f) if, on the other hand, the bottom layer 42 adheres to relatively smooth area(s) S but not to the area(s) with increased roughness R, or only weakly to the area(s) with increased roughness R, then the completed micromachine will be affixed to the substrate 40 at points where it is in contact with the relatively smooth area(s) S, but will be free to come off the substrate 40 at points where it is in contact with the area(s) with increased roughness R.

Each one of the two structural layers 42 and 44 may be metal films, grown or deposited oxides, or polymers. Other materials are not excluded.

EXAMPLE 4

Figure 16:
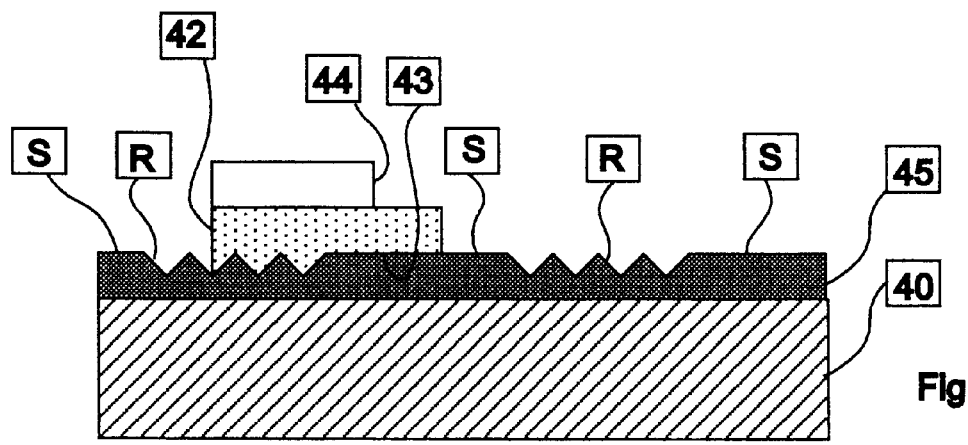
FIG. 16 is a cross-sectional view illustrating a fourth embodiment (Example 4) of the invention for the manufacturing of micromachines which are at least partially releasable.

As a modification of Example 3, a micromachine may be manufactured as illustrated in FIG. 16, using a substrate that has deposited over it a base layer having surface areas with different roughness. Thus, this Example 4 is essentially identical with Example 3 described above, except that a base layer 45 is deposited on the substrate 40, the outer surface of the base layer 45 having at least one relatively smooth area S and one area with increased roughness R as in Example 3.

EXAMPLE 5

Figure 17:
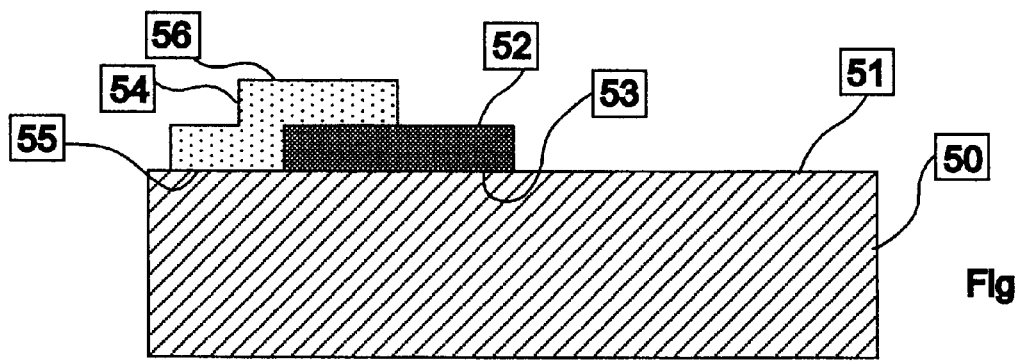
FIG. 17 is a cross sectional view illustrating a fifth embodiment (Example 5) of the invention for the manufacturing of micromachines which are at least partially releasable.
Figure 18A:
FIGS. 18–23 illustrate the process steps according to a sixth embodiment (Example 6) of the present invention for the manufacturing of a completely loose micromachined structure.
Figure 18B:
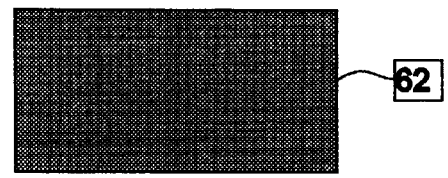

A micromachine may be manufactured according to the following steps with reference to FIG. 17, using as the first layer of the micromachine an adhesive thin film on a simple flat substrate:

a) a substrate 50, having an outer surface 51, is at least partly covered with a first layer 52, which has an inner surface 53 strongly adhering to the outer surface 51 of the substrate 50 and which is the bottom-most-layer of the to-be-deposited layers comprising the micromachine;

b) the first layer 52 is at least partly patterned;

c) a second layer 54, having an inner surface 55, is deposited onto the substrate 50 and possibly also onto the first layer 52, the second layer 54 having an adhesiveness such that its inner surface 55 adheres less strongly to the outer surface 51 than does the inner surface 53, but that its inner surface 55 adheres strongly to the first layer 52;

d) optionally, the second layer 54 is patterned;

e) possibly remaining further layers, such as layer 56, comprising the micromachine are deposited onto the second layer 54 and possibly also onto the first layer 52 and/or the outer surface 51 and are patterned according to the design of the micromachine;

f) since the first layer 52 adheres to the outer substrate surface 51, but the second layer 54 does not adhere or adheres only weakly to the substrate surface 51, the completed micromachine will be affixed to the substrate 50 at points where the layer 52 is in contact with the outer substrate surface 51 but will be free to come off the substrate 50 at points where the second layer 54 is in contact with the outer substrate surface 51.

The layers 52, 54 and 56 may be metal films, grown or deposited oxides, or polymers.

The difference between Example 5 and Example 2 is that whereas in Example 2, the substrate surface is modified to produce areas with different adhesiveness to the micromachine, or parts of the micromachine, in Example 5 the micromachine is made up of parts (52 and 54) with different adhesitivity to the substrate surface 51. For instance, if the micromachine were made up of chromium and gold parts, and the substrate was silicon, then parts of the micromachine made of chromium would stick to the surface, but the gold parts would not.

EXAMPLE 6

A micromachine may be manufactured according to the following steps with reference to FIGS. 18–23, resulting in a completely loose micromachine.

Figure 19A:
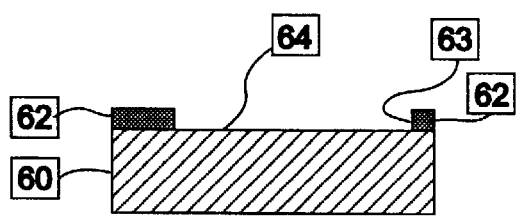
Figure 19B:
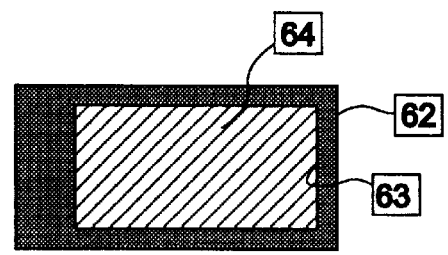
Figure 20A:
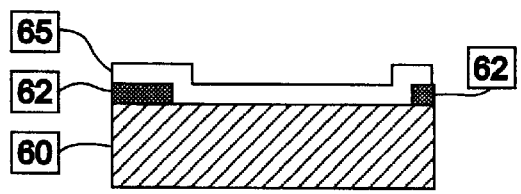
Figure 20B:
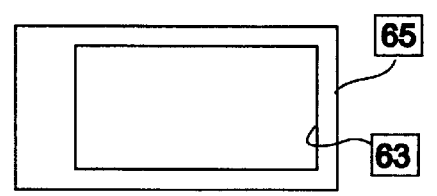
Figure 21A:
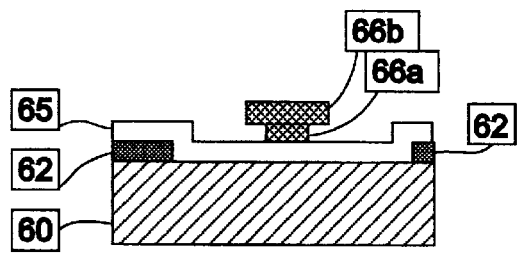
Figure 21B:
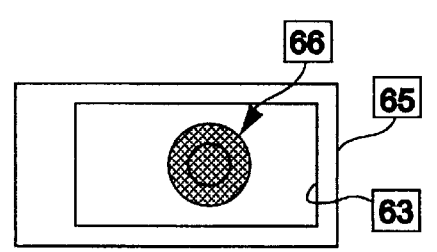
Figure 22A:
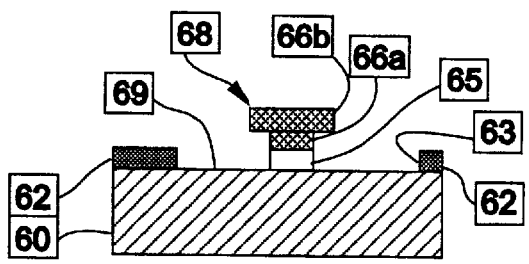
Figure 22B:
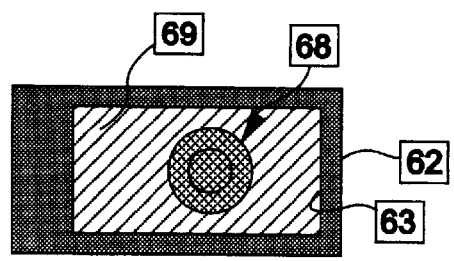

In a first step (FIG. 18), a first layer 62 of e.g. chromium is deposited on a surface of a substrate 60. In this example, it is essential that the first layer 62 adheres relatively strong to the substrate 60. In a second step (FIG. 19), the first layer 62 is patterned. As best shown in FIG. 19b, the thus-patterned first layer 62 may be in the form of a frame defining a rectangular opening 63 exposing a bare or free substrate surface area 64. In a third step (FIG. 20), a second layer 65, e.g. in the form of a Au layer, is deposited over the patterned first layer 62 and over the exposed substrate surface area 64. In this example, it is essential that the adhesiveness between the second layer 65 and the first layer 62 is greater than the adhesiveness between the second layer 65 and the substrate surface 64. Especially, the adhesiveness between the second layer 65 and the substrate surface 64 should preferably be insignificant. The completed micromachined structure 68 (see FIG. 23) will include, as its bottom layer, a portion of the second layer 65. The above three steps may be performed according to Example 1.

As a fourth step (FIG. 21), a third layer 66a, such as a polyimide layer, is deposited on the second layer 63. In this example, it is essential that the third layer 66a is located within the opening 63, i.e. not above the patterned first layer 62. in this example, a fourth layer 66b, such as another polyimide layer, is deposited over the third layer 66a. The completed micromachined multilayer structure 68 (see FIG. 23) will also include portions of the third and fourth layers 66a and 66b. The T-shape illustrated may be manufactured by using the sacrificial-layer technique described above. Other shapes are of course also possible.

Figure 23A:
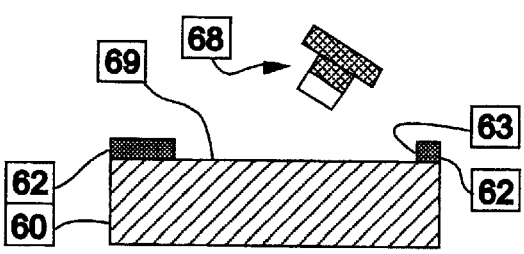
Figure 23B:
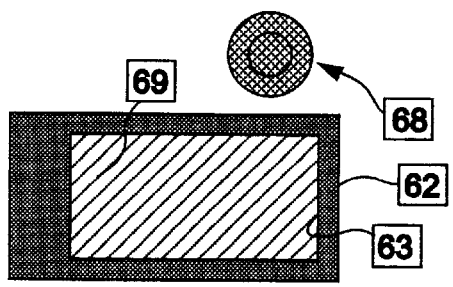

In a fifth step (FIG. 22), the second layer 65 is removed, e.g. by an etching process, except the portion thereof located between the substrate surface 64 and the third layer 66a, leaving an exposed area 69 of the substrate 60. Thereby, the completed multilayer structure 68 (65, 66a and 66b) is free to come off the substrate 60, as illustrated in FIG. 23.

Further Characteristics and Modifications

The following modifications and alternatives apply to all of the above described Examples 1–6, as well as in other embodiments included in the present invention:

1. The deposition of layers may be accomplished in different ways, such as spin-coating, vacuum deposition, sputtering and electrochemical processes. It is preferable that a layer is cleaned from unwanted contamination, oxides or other unwanted deposits prior to the deposition of subsequent layers;

2. The patterning of layers may be accomplished in different ways according to the material of the respective layer and the dimensions to be realized. Photolithography and etching care the preferred methods, but the use of methods such as screen printing, lift-off and deposition through shadow masks are also possible.

3. The substrate may be simple, consisting of a single material, or may be a complex, previously fabricated or prepared article. Examples of the former include wafers comprising silicon, silicon dioxide or silicon carbide, gallium arsenide wafers, glass slides, metal sheets and plastic sheets. Examples of the latter include oxidized silicon wafers, silicon wafers with a deposited layer of silicon carbide, silicon wafers containing a possibly patterned chemical monolayer, and silicon wafers containing circuitry, sensors, or other micromachined structures. Other, non-listed, materials and material combinations are not excluded.

4. The surface area(s), such as S and R, of the substrate 20 may be flat, curved, stepped, discontinuous, or containing channels, wells, pits, or holes. Other topographies are not excluded. Examples of flat areas include new silicon wafers and glass slides. Examples of areas containing channels or holes include etched silicon wafers. Area(s) with increased roughness (R) mall be produced by wet or dry chemical etching or by mechanical polishing, but other methods are not excluded.

5. Examples of metal films include gold, aluminum, and platinum. Examples of oxides include SiO2 and phosphosilicate glass. Examples of polymers include polyimide and benzocyclobutene. Examples of monolayers include hexamethyldisilazane, over Si or SiO2, and alkanethiols, over gold.

6. The layers may be patterned at a point in the processing sequence other than where described above; other layers may be deposited and patterned at any point in the above described sequence of steps that do not alter the essential points of the manufacturing method, for example because they lie adjacent to some of the layers described in the Examples above. Also, the layers may be subjected to further processing in addition to patterning. An example of a different sequence for the patterning is that the second or bottom layer of the micromachine is patterned after the deposition of additional layers thereof, rather than before.

7. Examples of other layers that may be deposited include metals for electrical connection to the micromachined structure, alignment marks, circuits, sensors and other micromachined structures.

8. Examples of additional processing include doping of deposited polysilicon layers, growing of oxides on the deposited layers, annealing. Unlisted additional layers and unmentioned further processing steps are not excluded.

9. The process steps and structures shown and described in Examples 1–6 could be combined.

References

Ref. 1 J. Bryzek, K. Peterson and W. McCulley, "Micromachines on the march", IEEE Spectrum, May 1994, pp. 20–31.

Ref. 2 G. DeLaPierre, "Micro-machining: a survey of the most commonly used processes", Sensors and Actuators, 17 (1989), pp 123–138, and references therein.

Ref. 3 J.-A. Schweitz, "Mikromekanik", presented at Micro Structure Workshop 1994, Uppsala, Sweden, Mar. 24–25, 1994, pp.1–9.

Ref. 4 T. Akiyama and K. Shono, "Controlled stepwise motion in polysilicon microstructures", J. Micromech. Syst., 2(3), 1993, pp. 106–110.

Ref. 5 M. Ataka, A. Omodaka, N. Takeshima and H. Fujita, "Fabrication and operation of polyimide bimorph actuators for a ciliary motion system", J. Micromech. Syst., 2(4), 1993, pp. 146–150.

Ref. 6 W.-S. Choi and J. G. Smits, "A method to etch undoped silicon cantilever beams", J. Micromech. Syst., 2(2), 1993, pp. 82–86.

Ref. 7 P. Schiller, D. L. Polla and M. Ghezzo, "Surface-micromachined piezoelectric pressure sensors", IEEE Solid State Sensor and Actuator Workshop, Hilton Head Island, S.C., USA, Jun. 4–7, 1990, pp. 188–190.

Ref. 8 T. R. Christenson, H. Guckel, K. J. Skrobis and T. S. Jung, "Preliminary results for a planar microdynamometer", IEEE Solid State Sensor and Actuator Workshop, Hilton Head Island, S.C., USA, Jun. 22–25, 1992, pp. 6–9.

Ref. 9 R. L. Alley, G. J. Cuan, R. T. Howe and K. Komvopoulos, "The effect of release-etch processing on surface microstructure stiction", IEEE Solid State Sensor and Actuator Workshop, Hilton Head Island, S.C., USA, Jun. 22–25, 1992, pp. 202–207.

Ref. 10 H. Guckel, C. Rypstat, M. Nesnidal, J. D. Zook, D. W. Burns and D. K. Arch, "Polysilicon resonant microbeam technology for high performance sensor applications", IEEE Solid State Sensor and Actuator Workshop, Hilton Head Island, S.C., USA, Jun. 22–25, 1992, pp. 153–156.

What is claimed is:

1. A method for producing a microfabricated component that either has a movable part or is completely movable, comprising:
    a) selecting a substrate;
    b) putting on said substrate region to which said component will adhere and regions to which it will not adhere, or putting onto said substrate said component that has regions that will adhere and regions that will not adhere to the substrate;
    c) actuating the component or part of the component so that where it is not adhered, it will come off the substrate surface.

2. A method as claimed in claim 1, wherein the adhering region is an adhesion-promoting layer.

3. A method as claimed in claim 1, wherein the non-adhering region is an adhesion-preventing layer.

4. A method as claimed in claim 1, wherein the adhering and non-adhering regions are regions of roughness and/or smoothness.

5. A method as claimed in claim 1, whereby the component presents a first free-standing or movable part and a second part attached to the substrate surface.

6. A method as claimed in claim 1, wherein the substrate comprises at least one element selected from the group consisting of: silicon, silicon dioxide, silicon carbide, or glass; silicon, silicon dioxide, silicon carbide, or glass with overlying grown or deposited layers; silicon, silicon dioxide, silicon carbide, or glass with overlying structures, devices, or circuitry; silicon, silicon dioxide, silicon carbide, or glass which has already been partly micromachined or structured.

7. A method as claimed in claim 2, wherein the adhesion-promoting layer comprises at least one element selected from the group consisting of: chromium, titanium, nickel, a mixture comprising titanium, tungsten, and nitrogen, and an alloy comprising titanium, tungsten, and nitrogen.

8. A method as claimed in claim 1, wherein one layer of the component comprises at least one element selected from the group consisting of: gold, platinum, and palladium.

9. A method as claimed in claim 1, wherein the regions that will adhere encircles the regions that will not adhere.

10. A method as claimed in claims 1, wherein the adhering region is an adhesion-promoting layer or the non-adhering region is an adhesion-preventing layer, whereby the completed structure presents a first free-standing or movable part and a second part attached to the substrate surface.

11. A method as claimed in claim 10, wherein the substrate comprises at least one element selected from the group consisting of: silicon, silicon dioxide, silicon carbide, or glass; silicon, silicon dioxide, silicon carbide, or glass with overlying grown or deposited layers; silicon, silicon dioxide, silicon carbide, or glass with overlying structures, devices, or circuitry; silicon, silicon dioxide, silicon carbide, or glass which has already been partly micromachined or structured.

12. A method as claimed in claim 11, wherein one layer of the component comprises at least one element selected from the group consisting of: gold, platinum, and palladium.

13. A method as claimed in claim 12, wherein the regions that will adhere encircles the regions that will not adhere.

14. A micromachined structure or component manufactured according to claim 1.

15. A micromachined structure or component manufactured according to claim 2.

* * * * *